US011196158B2

United States Patent
Chiang et al.

(10) Patent No.: US 11,196,158 B2
(45) Date of Patent: Dec. 7, 2021

(54) ELECTRIC COMPOSITE DETECTION ANTENNA

(71) Applicant: HOLY STONE ENTERPRISE CO., LTD., Taipei (TW)

(72) Inventors: Chiu-Lin Chiang, Taipei (TW); Chang-Ching Lin, Taipei (TW); Chih-Chung Lin, Taipei (TW)

(73) Assignee: HOLY STONE ENTERPRISE, CO., LTD., Taipei (TW)

( * ) Notice: Subject to any disclaimer, the term of this patent is extended or adjusted under 35 U.S.C. 154(b) by 222 days.

(21) Appl. No.: 16/002,553

(22) Filed: Jun. 7, 2018

(65) Prior Publication Data
US 2018/0375206 A1 Dec. 27, 2018

(30) Foreign Application Priority Data

Jun. 8, 2017 (TW) ................................. 106119089
May 23, 2018 (TW) ................................. 107117589

(51) Int. Cl.
| | | |
|---|---|---|
| H01Q 3/24 | (2006.01) |
| H04B 5/00 | (2006.01) |
| H01Q 19/02 | (2006.01) |
| H01Q 5/335 | (2015.01) |
| G01V 3/10 | (2006.01) |

(Continued)

(52) U.S. Cl.
CPC ............... *H01Q 3/24* (2013.01); *G01V 3/101* (2013.01); *H01Q 5/335* (2015.01); *H01Q 7/00* (2013.01); *H01Q 19/025* (2013.01); *H03G 3/3042* (2013.01); *H04B 5/0043* (2013.01)

(58) Field of Classification Search
CPC .......... H01Q 3/24; H01Q 7/00; H01Q 19/025; H01Q 5/335; H01Q 1/0475; H01Q 1/12; H01Q 1/18; H01Q 1/40; H01Q 1/24; H01Q 1/26; H01Q 23/00; H03G 3/3042; H04B 5/0043; H04B 7/0602; H04B 7/0805; G01V 3/101
See application file for complete search history.

(56) References Cited

U.S. PATENT DOCUMENTS

| | | | | |
|---|---|---|---|---|
| 2010/0279734 A1* | 11/2010 | Karkinen | ............... | H01Q 5/321 455/554.2 |
| 2011/0059694 A1* | 3/2011 | Audie | ..................... | H04B 5/00 455/41.1 |
| 2018/0278099 A1* | 9/2018 | Hong | ..................... | H02J 50/40 |

FOREIGN PATENT DOCUMENTS

CN 103401577 * 7/2013

* cited by examiner

*Primary Examiner* — Awat M Salih
(74) *Attorney, Agent, or Firm* — Muncy, Geissler, Olds & Lowe, P.C.

(57) ABSTRACT

An electric composite detection antenna is disclosed. The antenna includes two RF antenna disposed on two sides of the circuit system of the electronic device, and a RF compensation system is disposed in the circuit system and includes an inductive sensing coil, and the induction coil can detect signal attenuation of any RF antenna subjected to external interference, so as to generate a detection signal. The RF compensation system can notice the control unit, to quickly drive any antenna matching circuit to switch to the RF antenna which is not interfered, or to quickly adjust antenna power or adjust the matching value of the RF antenna between the external environment, so that the preset electronic device can perform the stable transmission RF signal through the RF antenna without external interference, and maintain better power for RF signal transmissions.

2 Claims, 12 Drawing Sheets

(51) Int. Cl.
*H03G 3/30* (2006.01)
*H01Q 7/00* (2006.01)

ELECTRIC COMPOSITE DETECTION ANTENNA

This application claims the priority benefit of Taiwan patent application numbers 106119089 and 107117589, filed respectively on Jun. 8, 2017 and May 23, 2018.

BACKGROUND OF THE INVENTION

1. Field of the Invention

The present invention generally relates to an electric composite detection antenna, more particularly to an antenna device which is able to switch different antenna operations by detecting antenna signal attenuation, and use an inductive sensing coil to detect the signal attenuation of any one of the RF antennas, and use a RF compensation system, a RF unit, an antenna matching circuit to switch the non-interfered RF antenna to operate, or adjust antenna power or antenna matching, parameters in real time, thereby achieving stable transmission of RF signal.

2. Description of the Related Art

According to the continuous advancement of the electronic technology industry and the rapid development of the wireless communication industry, many electronic/electrical products used in daily life can transmit signal wirelessly, such as smart phones and GSM devices, personal digital assistants (PDA) or computers, and various electronic communication products or mobile devices such as computer peripherals, wireless network devices, notebook computers, and wireless network devices. In various electronic communication products or mobile devices, antenna has a very important role, for example, some common antennas such as monopole antenna, planar Inverted-F antenna (PIFA) or dipole antenna, are built in the electronic communication products for RF signal transmission. Generally, in order to extend a read range within an area and reduce the number of RFID readers, a radio frequency identification (RFID) system of the electronic communication product or the mobile device is provided with the RFID reader having multiple output ports; alternatively, the RFID system has an automatic backup mode in which a set of backup RFID readers (antennas) is added with each RFID reader (antenna). For example, when the product is located in the mountain area having no signal or weak signal, or away from the base station, or shielded by other object, or affected by metal object, there is a problem with the RFID reader of the electronic communication product to cause failure of normal operation and transmission of the RF signal. According to a link quality mechanism, the system unit can determine that the antenna transmission signal is not good and switch to the backup antenna after the determination, but it takes time to obtain the determination result. Obviously, the conventional switching mechanism affects the speed and quality of radio frequency signal transmission. Furthermore, in the conventional switching mechanism, before the antenna is switched, it is unable to determine the signal transmission status affected by the external interference and the antenna is switched because of poor signal, but the quality of the signal transmitted by the switched antenna (that is, the backup antenna) may be better or worse than the signal transmission quality of the original antenna; as a result, the conventional switching mechanism cannot ensure that the signal transmission quality of the switched antenna is better, and the conventional switching mechanism only can repeat switching operations of different antennas to find the antenna having better signal transmission quality. Generally, the signal transmission quality cannot be improved in a short time after external interference occurs. Furthermore, when two f RFID readers (antennas) are electrically connected to the same antenna module, a two-to-one RF switcher is required to switch the operation of the two RFID readers. The commercially available RFID readers include single port type, dual-port type, four-port type and eight-port type, and product designer also need to select the RF switcher with the same type upon actual application, but the controllers, transmission interfaces, and operation keys of the RF switcher also increase the hardware cost. Furthermore, when a larger size of RF switcher (such as four-port switcher or eight-port switcher) is used, some readers which are sometimes not used for the output antenna in practical applications also results in additional costs for the electronic communication product. Furthermore, an RF switching module can be provided in the electronic communication product, and the switching control operation is performed to determine the RF signal transmission power, and a power amplifier is used to compensate for the transmission power of the RF signal, so that the transmission power of the RF signal can match the predetermined power value, to reduce the signal attenuation of the RF signal caused by the influence of no signal, weak signal, or surrounding metal objects. However, such compensation operation may spend more system resource and time to repeatedly adjust the predetermined power value, and the radio frequency switching module may generate heat because of power increase; furthermore, the increase of the radio frequency signal transmission power is also limited, but the service life of the switching module and the electronic communication product are reduced.

Various electronic communication products, mobile devices may have different outer shells made of different materials such as insulating materials (such as plastic) or metal materials, so the antennas applied for these products must have different impedances and different types. For example, for the electronic communication product or the mobile device having metal case, a digital tuning capacitor can be provided in the product and can be dynamically adjusted to change a capacitor impedance value thereof. After the capacitance impedance value is changed, the waveform of a high frequency circuit system superimposed with a metal reflection signal may become ideal, but when the product is affected by external interference, the power and matching value of the antenna cannot be improved or adjusted instantaneously. There is still much room for the antenna adjustment scheme applied in the products.

Therefore, how to solve the problem that the RFID reader (transmitting antenna) of the electronic communication product is affected by external influence to have power drop, and how to provide the technical solution for the RFID reader to quickly switch antenna without spending much system time and system resource, are the key issues for relevant manufacturers.

SUMMARY OF THE INVENTION

In order to solve the above problems, the inventor develops electric composite detection antenna according to collected data, various tests and multiple modifications, and years of accumulated experience in the industry. The electric composite detection antenna can detect antenna signal attenuation automatically in real time by using the inductive sensing coil, so as to switch different antenna for operation;

alternatively, in the electric composite detection antenna, the inductive sensing coil is used to detect the signal attenuation of the RF antenna, and the RF compensation system can immediately adjust antenna power or antenna matching value, so as to achieve stable transmission of RF signal.

An objective of the present invention is that the electric composite detection antenna includes two RF antennas disposed on two sides of a circuit system of a preset electronic device, respectively, and the circuit system includes at least one inductive sensing coil disposed thereon and configured to detect magnitude of the transmission signal of each of the two RF antennas; preferably, the number of the inductive sensing coils is the same as the number of the RF antennas, for example, for the two RF antennas, two inductive sensing coils are disposed on the two sides of circuit system, respectively, so as to more accurately detect the magnitude of the transmission signal of each RF antenna. After the inductive sensing coil detects the signal attenuation of one of the RF antennas caused by external interference, such as the change in the external environment parameters, a detection signal is generated and transmitted to the RF compensation system. The RF compensation system transmits the detect signals to the RF unit, so that the RF unit can drive one of the antenna matching circuits disposed on the side of circuit system and having has better signal operation, to switch from the interfered RF antenna to the other RF antenna which is not subjected to external interference and the external environment parameters thereof do not change, so that the preset electronic device can perform the stable transmission RF signal through the non-interfered RF antenna, to maintain the better power and quality of RF signal transmission. Alternatively, the antenna device can use the at least one inductive sensing coil to detect whether the transmission signal is affected by external environment parameter, for example, when the at least one inductive sensing coil detects that the transmission signal is attenuated or affected by external interference, the at least one inductive sensing coil can transmit the detection result to the RF compensation system, which can be also called as a main unit system. The RF compensation system can further adjust or increase the power to the antenna matching circuit, or adjust a tunable capacitor to change the antenna matching value, so that the signal transmission of the electric composite detection antenna eventually becomes ideal.

Another objective of the invention is that the preset electronic device can be a smartphone or a tablet computer, and the two RF antennas are disposed on the two sides of the circuit system inside the preset electronic device, respectively, and at least one inductive sensing coil is disposed between two RF antennas of the circuit system or two inductive sensing coils are disposed on the two sides of two RF antennas of the circuit system, respectively, so as to detect the RF signal attenuation of each RF antenna caused by external interference. The external interference may be caused by a metal object close to and around preset electronic device, and it results in changes in the external environmental parameters.

Another object of the present invention is that the RF compensation system, which is also called the main unit system, can be a central processor, a microprocessor or a chip and can include a built-in program configured to drive the RF unit to switch any antenna operation; alternatively, the RF compensation system (or the main unit system) can be a central processor, a microprocessor or a chip, and can include the built-in program configured to adjust antenna power or adjust the tunable capacitor, so as to make antenna signal operation ideal.

Another objective of the present invention is that the antenna includes at least one RF antenna, at least one inductive sensing coil electrically connected to at least one RF antenna, a sensing unit electrically connected to at least one inductive sensing coil, at least one antenna matching circuit, and a RF unit. During the process of detecting whether any RF antenna is affected by the changes in the external environmental parameters (for example, the RF antenna is interfered when being located in remote mountainous areas or when an external metal object is close to the RF antenna), the RF unit can control any one of the at least one antenna matching circuit to transmit a power adjustment instruction for increasing the power to the at least one inductive sensing coil. By using two induction coils of at least one inductive sensing coil in cooperation with the sensing unit, the detection range of any RF antenna can be extended effectively, so as to increase the power of any antenna matching circuit to further increase the transmission power of any RF antenna, thereby increasing RF signal transmission power of any RF antenna in real time, to prevent the power and quality of RF signal transmission from being affected by the change in the external environmental parameters. As a result, the RF signal can be transmitted stably.

DETAILED DESCRIPTION OF THE PREFERRED EMBODIMENTS

Figure 1:
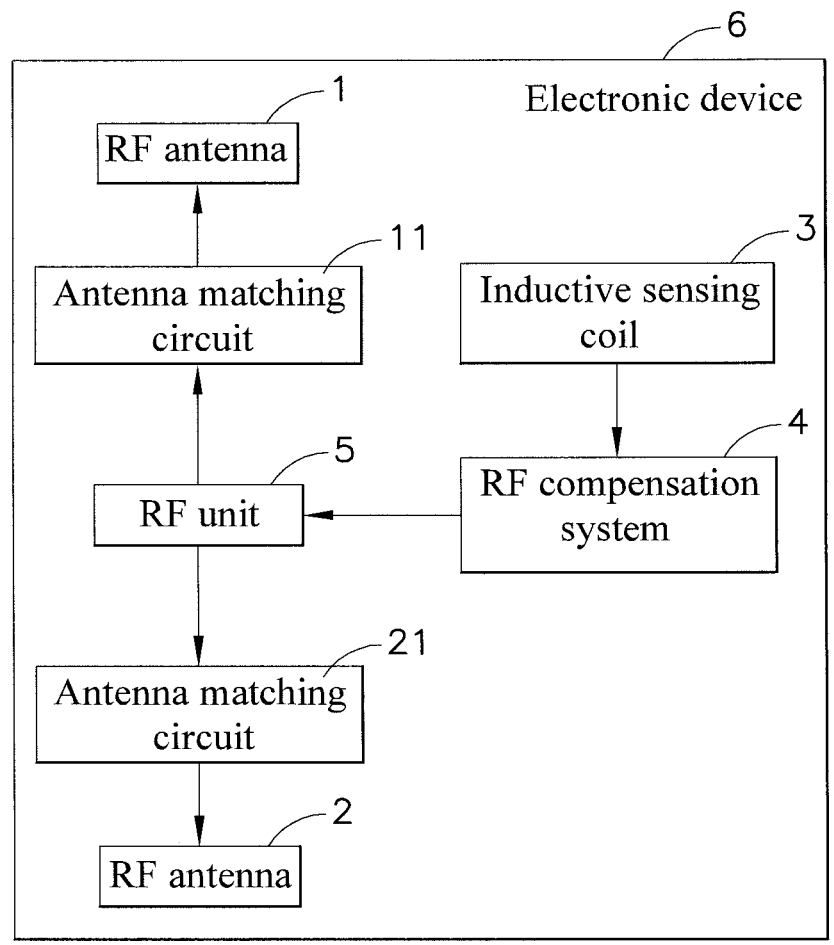
FIG. 1 is a simplified block diagram of an electric composite detection antenna of the present invention.

Please refer to FIGS. 1 to 6, which are simplified block diagram of the electric composite detection antenna of the present invention, simplified block diagram of the preferred embodiment, simplified block diagram of another embodiment, simplified circuit block diagram of an inductive sensing coil, schematic diagram of the first embodiment of the inductive sensing coil, and schematic diagram of the second embodiment of the inductive sensing coil, according to the present invention. The electric composite detection antenna comprises two RF antennas 1 and 2, at least one inductive sensing coil 3, a RF compensation system 4, a RF unit 5 and two antenna matching circuits 11 and 21.

The RF antennas 1 and 2 are electrically connected to the antenna matching circuits 11 and 21, respectively.

The inductive sensing coil 3 is electrically connected to the RF compensation system 4 and configured to receive a detection signal.

The RF compensation system 4 can be a central processor (CPU), a microprocessor, a chip, and so on, and a predetermined application program or driver can be built in the RF compensation system 4, and configured to drive the RF unit 5 to switch or select one of the RF antennas 1 and 2 having better signal to perform the wireless signal transmission. Alternatively, the built-in predetermined application program or driver can further increase the power of the antenna matching circuits 11 and 21 or dynamically adjust the tunable capacitor (DTC), so that the wireless transmission quality of any one of the RF antennas 1 and 2 can tend to be ideal.

When the above components are applied, the RF antennas 1 and 2 are disposed at two sides of an outer shell or a circuit system of the preset electronic device 6, respectively, and the at least one inductive sensing coil 3 and the RF compensation system 4 are disposed in a preset circuit system, and the at least one inductive sensing coil 3 is electrically connected to the RF antennas 1 and 2; preferably, the number of the at least one inductive sensing coil can also match the number of the RF antennas, for example, the two inductive sensing coils are disposed at two sides of the two RF antennas, respectively, so as to more accurately detect the magnitude of the transmission signal of each RF antenna. The RF compensation system 4 is electrically connected to the at least one inductive sensing coil 3 and the RF unit 5, that is, the RF compensation system 4 is electrically connect to the antenna matching circuits 11 and 21 through the RF unit 5, and uses at least one inductive sensing coil 3 to sense and detect the magnitude of the RF signal of each of the RF antennas 1 and 2. The result of detecting the RF signal is transmitted to the RF compensation system 4, and then transmitted to the RF unit 5 through the RF compensation system 4. The RF unit 5 can select and operate any one of the antenna matching circuits 11 and 21, so as to switch any one of the RF antennas 1 and 2 to operate. As a result, the RF antennas 1 and 2, the two antenna matching circuits 11 and 21, the at least one inductive sensing coil 3, the RF compensation system 4 and the RF unit 5 can form the electric composite detection antenna of the present invention.

Figure 2:
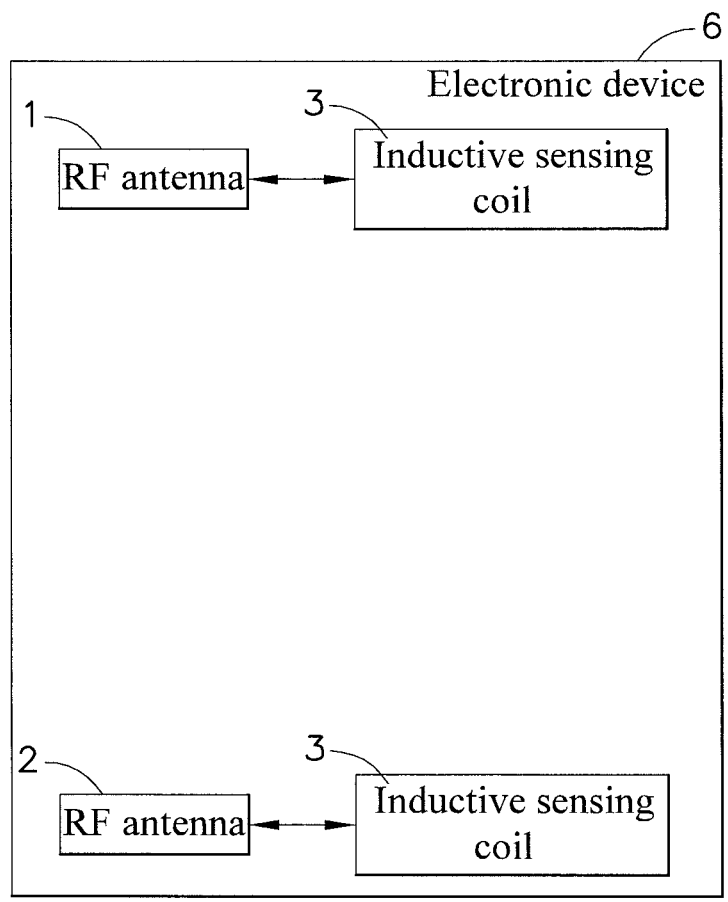
FIG. 2 is a simplified block diagram of an electric composite detection antenna of a preferred embodiment of the present invention.
Figure 3:
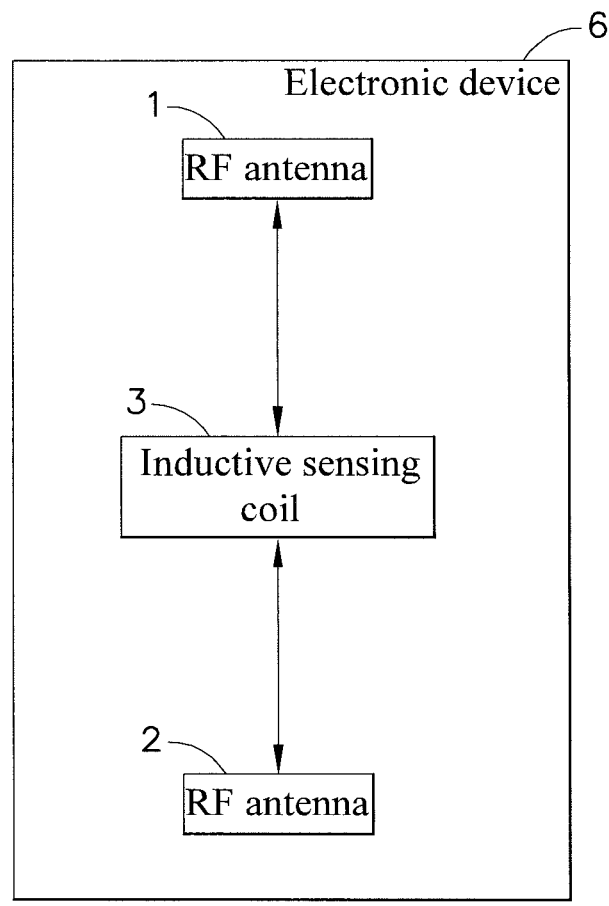
FIG. 3 is a simplified block diagram of an electric composite detection antenna of another embodiment of the present invention.
Figure 4:
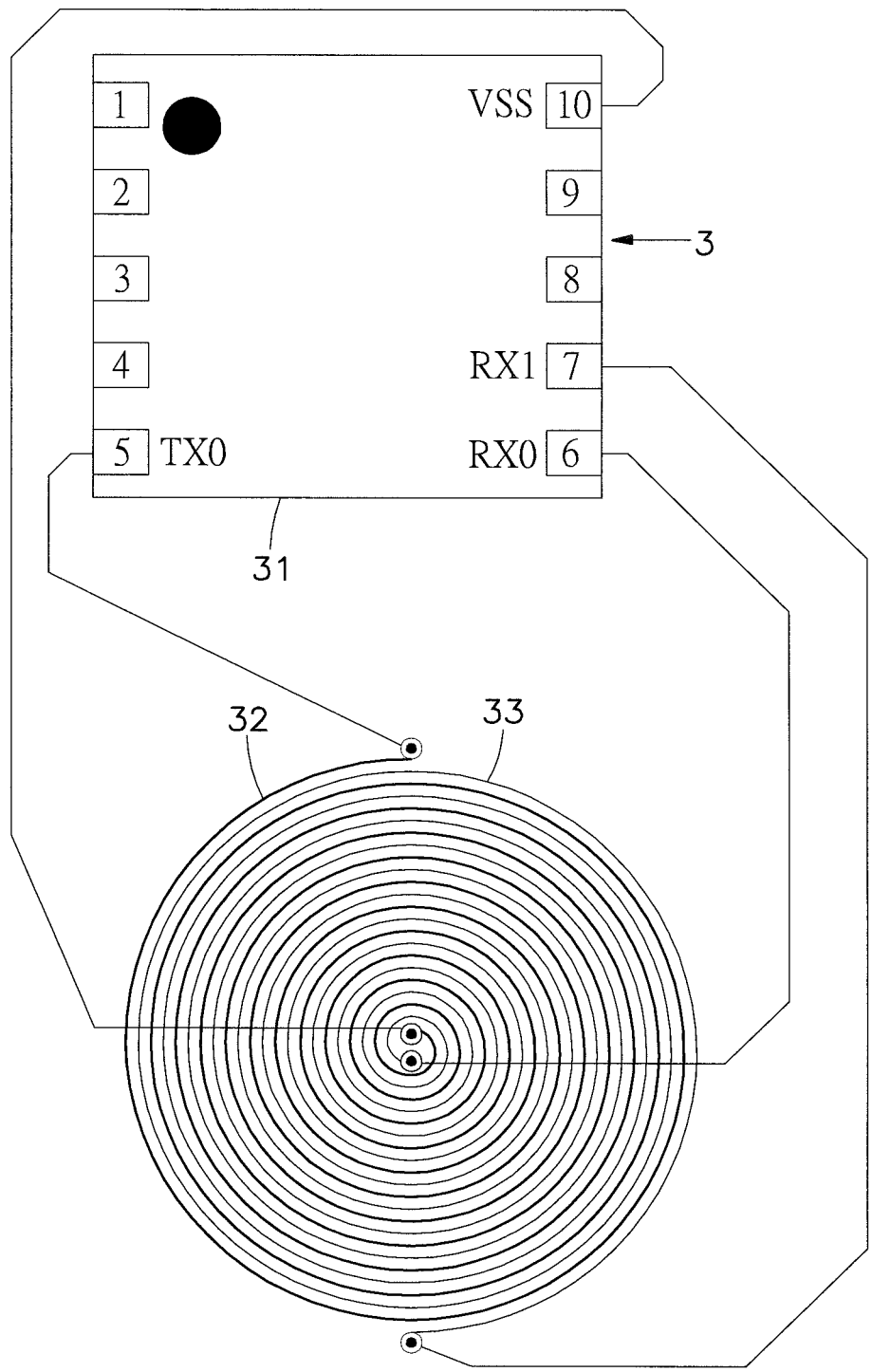
FIG. 4 is a simplified circuit block diagram of an inductive sensing coil of the present invention.
Figure 5:
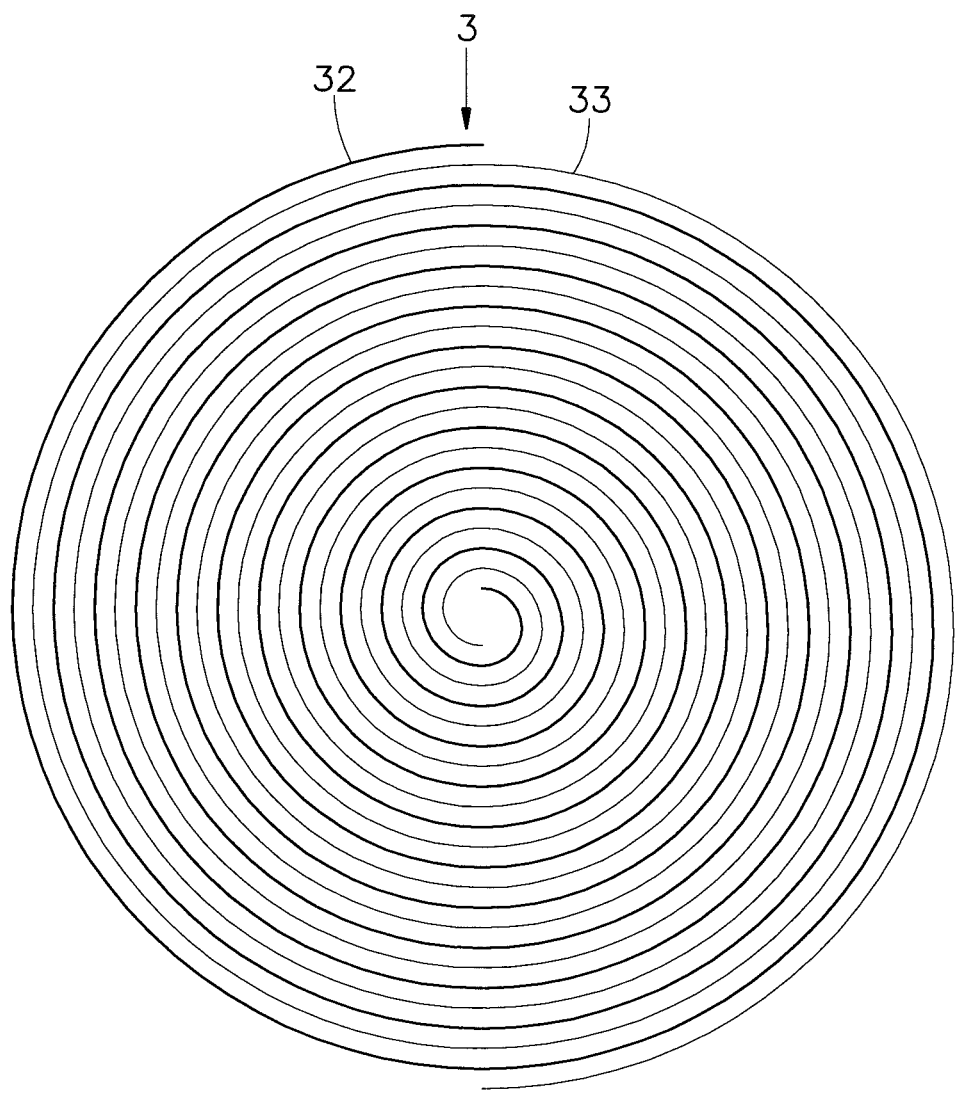
FIG. 5 is the design diagram of the first embodiment of an inductive sensing coil of the present invention.
Figure 6:
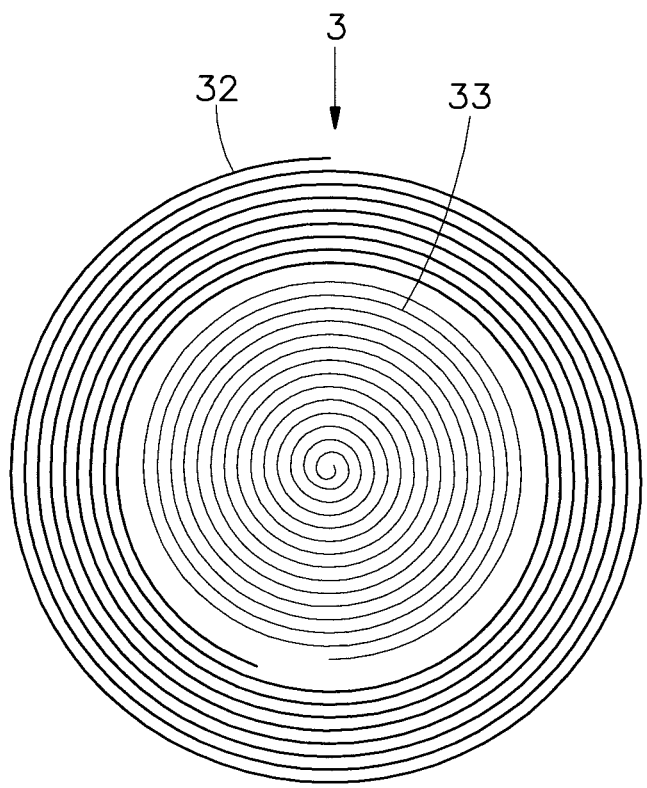
FIG. 6 is a diagram of a second embodiment of an inductive sensing coil according to the present invention.
Figure 7:
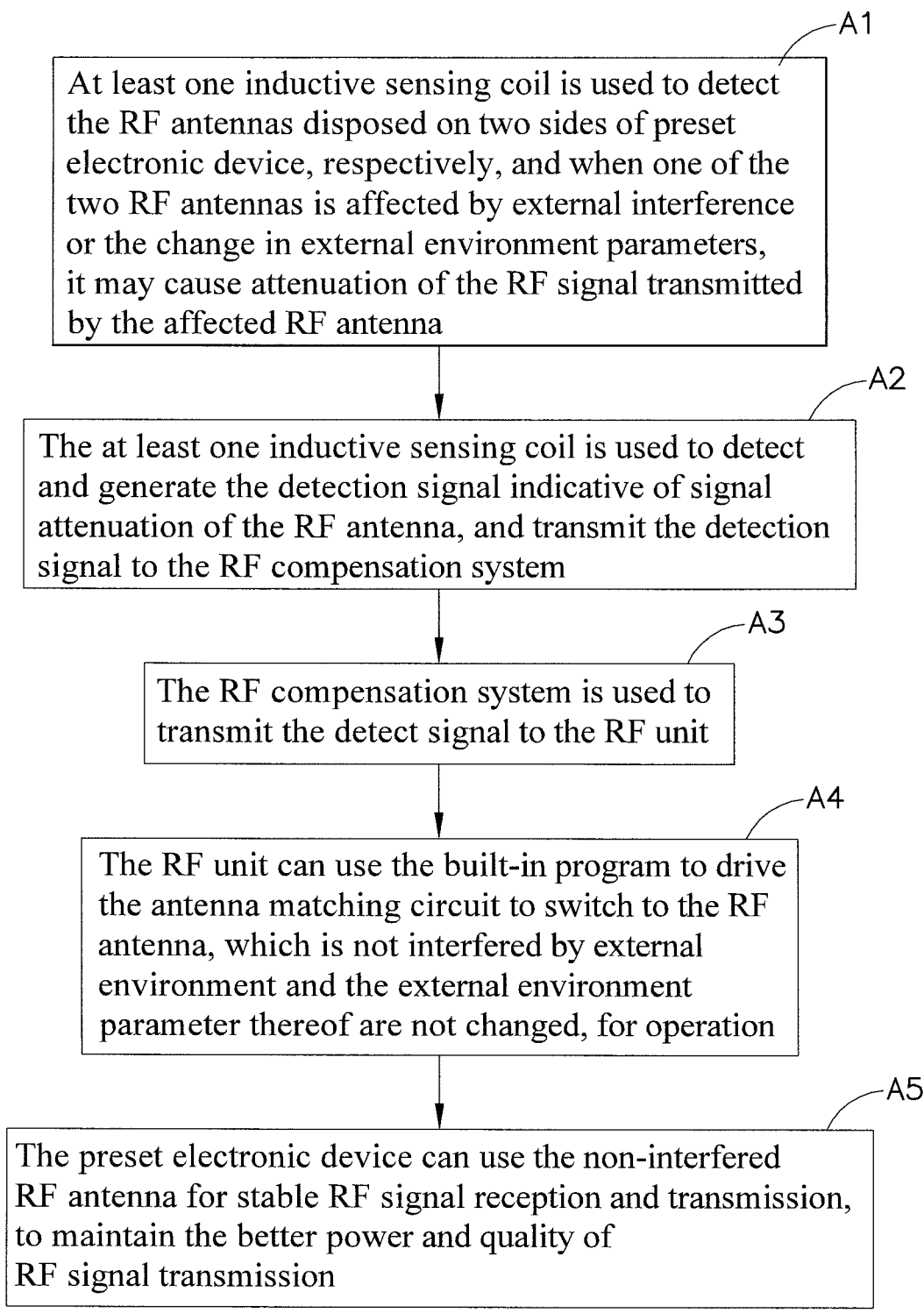
FIG. 7 is a flowchart of an antenna adjustment method according to the present invention.

As mentioned above, the preset electronic device 6 can be a mobile device or an electronic communication product, such as a smartphone or a tablet computer, and the RF antennas 1 and 2 and the antenna matching circuits 11 and 21 can be disposed on two opposite side of the outer shell or the circuit system of the preset electronic device 6, respectively; the inductive sensing coil 3 can be disposed between the two RF antennas 1 and 2 (such as the embodiment shown in FIG. 3), and the inductive sensing coil 3 can be used to detect the RF signal transmission conditions of the RF antennas 1 and 2; alternatively, two inductive sensing coils 3 are disposed at two sides of the RF antennas 1 and 2, respectively (as shown in the embodiment of FIG. 2), and the two inductive sensing coils 3 are used to detect RF signal transmission conditions of the RF antennas 1 and 2 in real time, respectively, and determine whether any one of the two RF antennas 1 and 2 are interfered by an external metal object. The RF unit 5 can select one of the antenna matching circuits 11 and 21 to switch different one of the RF antennas 1 and 2, so that the RF antenna 1 or the RF antenna 2 not interfered by a metal object can be selected to transmit the RF signal.

Furthermore, the at least one inductive sensing coil 3 can comprise a wireless communication module 31, and a first induction coil 32 and a second induction coil 33 electrically connected to the wireless communication module 31. The wireless communication module 31 can use the first induction coil 32 to detect the RF signals (TX) transmitted by the RF antennas 1 and 2, and use the second induction coil 33 to detect any RF signals (RX) received by the RF antennas 1 and 2. According to the power of any one of the RF antennas 1 and 2 transmitting or receiving RF signal detected by the wireless communication module 31, the inductive sensing coil 3 can determine whether any one of the RF antennas 1 and 2 is interfered by the metal object close thereto, and the RF compensation system 4 can transmit the detection signal to the RF unit 5, and the RF unit 5 then transmits a control signal (CTRL) to any one of the antenna matching circuits 11 and 21 for switching electrical connection between any one of the antenna matching circuits 11 and 21 and any one of the RF antennas 1 and 2, so that one of the RF antennas 1 and 2 not interfered by the a metal object close thereto can be selected to transmit and receive the RF signal; as a result, the at least one induction coil 3 can determine, in real time, whether any one of the RF antennas 1 and 2 is interfered by an external metal object, and the RF compensation system 4 and the RF unit 5 can switch electrical connection between any one of the antenna matching circuits 11 and 21 and any one of the RF antennas 1 and 2, so as to quickly switch any one of the RF antennas 1 and 2 to transmit the RF signal, thereby stably maintaining power of RF signal transmission of the preset electronic device 6.

Please refer to FIGS. 1 to 4, and 7, which are simplified block diagram of the electric composite detection antenna, simplified block diagram of a preferred embodiment, simplified block diagram of other embodiment, simplified circuit block diagram of an inductive sensing coil, and flow chart of an antenna adjustment method, according to the present invention. The electric composite detection antenna of the present invention can comprise the two RF antennas 1 and 2, the at least one inductive sensing coil 3, the RF compensation system 4, the RF unit 5 and the two antenna matching circuits 11 and 21, the antenna adjustment method includes following steps.

In step (A1), at least one inductive sensing coil 3 is used to detect the RF antennas 1 and 2 disposed on two sides of the preset electronic device 6, respectively. When the RF antenna 1 or the RF antenna 2 is affected by external interference or the change in external environment parameters, it may cause attenuation of the RF signal transmitted by the RF antenna 1 or the RF antenna 2.

In step (A2), the at least one inductive sensing coil 3 is used to detect and generate the detection signal indicative of signal attenuation of the RF antenna 1 or the RF antenna 2, and transmit the detection signal to the RF compensation system 4.

In step (A3), the RF compensation system 4 is used to transmit the detect signal to the RF unit 5.

In step (A4), the RF unit 5 can use the built-in program to drive the antenna matching circuit 11 (or the antenna matching circuit 21), to switch from the affected RF antenna to, through the antenna matching circuit 21, (or the antenna matching circuit 11) the RF antenna 2 (or the RF antenna 1), which is not interfered by external environment and the external environment parameter thereof are not changed, for operation.

In step (A5), the preset electronic device 6 can use the RF antenna 2 (or the RF antenna 1) for stable RF signal reception and transmission, thereby maintaining the better power and quality of RF signal transmission.

As mentioned above, when the external environment parameters of the preset electronic device 6 change, for example, a metal object approaches the preset electronic device 6 to cause the change in the external environment parameters, the RF antennas 1 and 2 on the two sides of the outer shell or the electronic circuit system of the preset electronic device 6 are affected, it may decrease and decay the RF signal transmission power of the RF antenna 1 (or the RF antenna 2) which is close to the metal object, and the wireless communication module 31 of the inductive sensing coil 3 can use the first induction coil 32 to detect the RF signal TX transmitted by the RF antenna 1 (or the RF antenna 2), and use the second induction coil 33 to detect the RF signal RX received by the RF antenna 1 (or the RF antenna 2). According to the transmission and receiving power of the RF antenna 1 (or the RF antenna 2) detected by the wireless communication module 31, the inductive sensing coil 3 can determine whether the RF antenna 1 (or the RF antenna 2) is interfered by an external metal object, and the RF compensation system 4 can transmit the detection signal to the RF unit 5. Next, the RF unit 5 transmits the control signal (CTRL) to the antenna matching circuit 11 (or antenna matching circuit 21), so as to switch the electric connection between the antenna matching circuit 11 or the antenna matching circuit 21, and the RF antenna 1 or the RF antenna 2, so that the other of the antenna matching circuit 21 or the antenna matching circuit 11 can switch to the RF antenna 1 or the RF antenna 2 not interfered by an external non-proximity metal object, for the transmission and reception of the RF signal without affecting the RF signal transmission power of the preset electronic device 6; as a result, the RF signal can be transmitted stably. Furthermore, in any of the embodiments of the present invention, the geometric shape of the RF antenna 1 or the RF antenna 2 is not limited to above examples, and can be square or elliptical shape, or may be shape of the embodiment shown in FIG. 5 or FIG. 6; however, the antenna structure must be formed by a combination of the two induction coils 32 and 33, and the lengths of the two induction coils 32 and 33 are the same.

Figure 8:
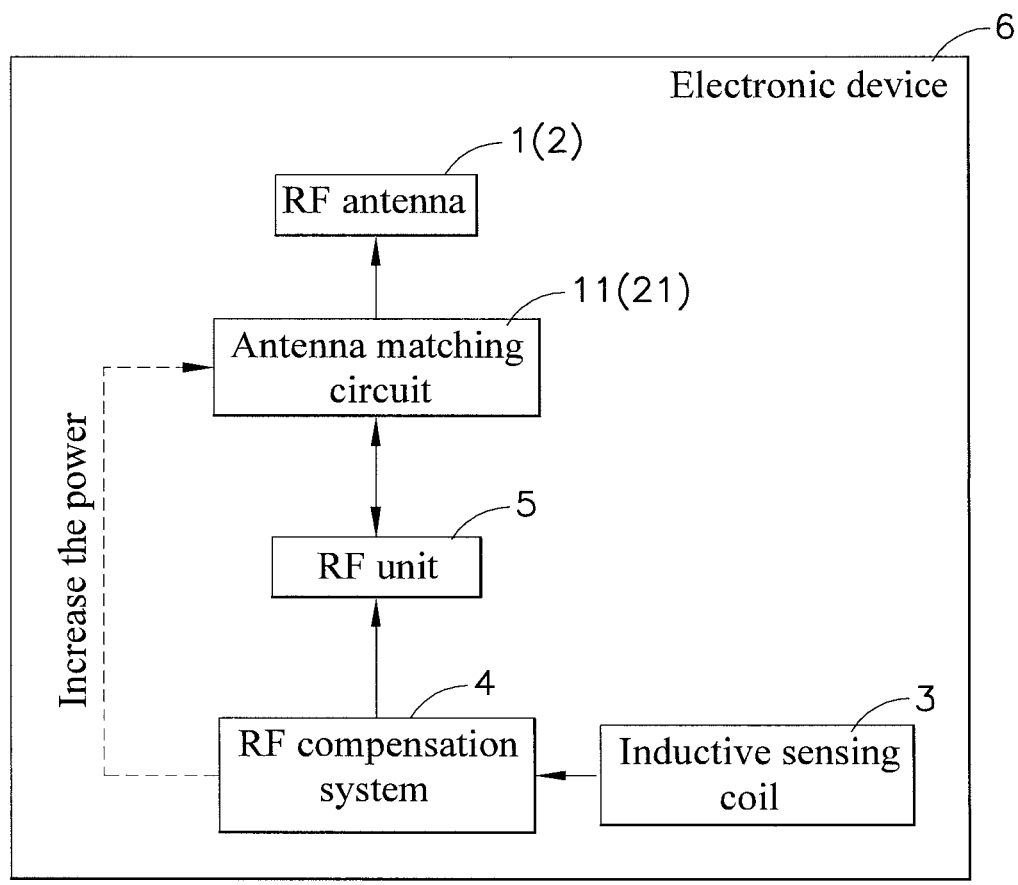
FIG. 8 is a simplified block diagram of an electric composite detection antenna of the first embodiment of the present invention.

Please refer to FIGS. 1 and 8, which are simplified block diagram of the electric composite detection antenna of the present invention, and simplified block diagram of the first embodiment, according to the present invention. The electric composite detection antenna comprises the at least one RF antenna 1 (or the RF antenna 2), the at least one inductive sensing coil 3, the RF compensation system 4, the RF unit 5 and the at least one antenna matching circuit 11 (or the antenna matching circuit 21). The electric composite detection antenna is applicable to the preset electronic device 6 having a communication interface (which is the RF antenna 1 (or the RF antenna 2)). When the at least one inductive sensing coil 3 detects that one of the RF antenna 1 and the RF antenna 2 is affected by the change in the external environmental parameters, for example, when the preset electronic device 6 is located in remote mountain areas, inside buildings, away from the base station area, or near to an external metal object, and the RF compensation system 4 can transmit the detection signal to the RF unit 5, and the RF compensation system 4 can increase the power of the antenna matching circuit 11 (or the antenna matching circuit 21) to further increase the transmission power of the RF antenna 1 (or the RF antenna 2), so as to increase the RF signal transmission power of any one of the RF antennas 1 and 2 in real time, thereby preventing the power and quality of RF signal transmission from being affected by the change in the external environmental parameters. As a result, the RF signal can be transmitted stably.

Figure 9:
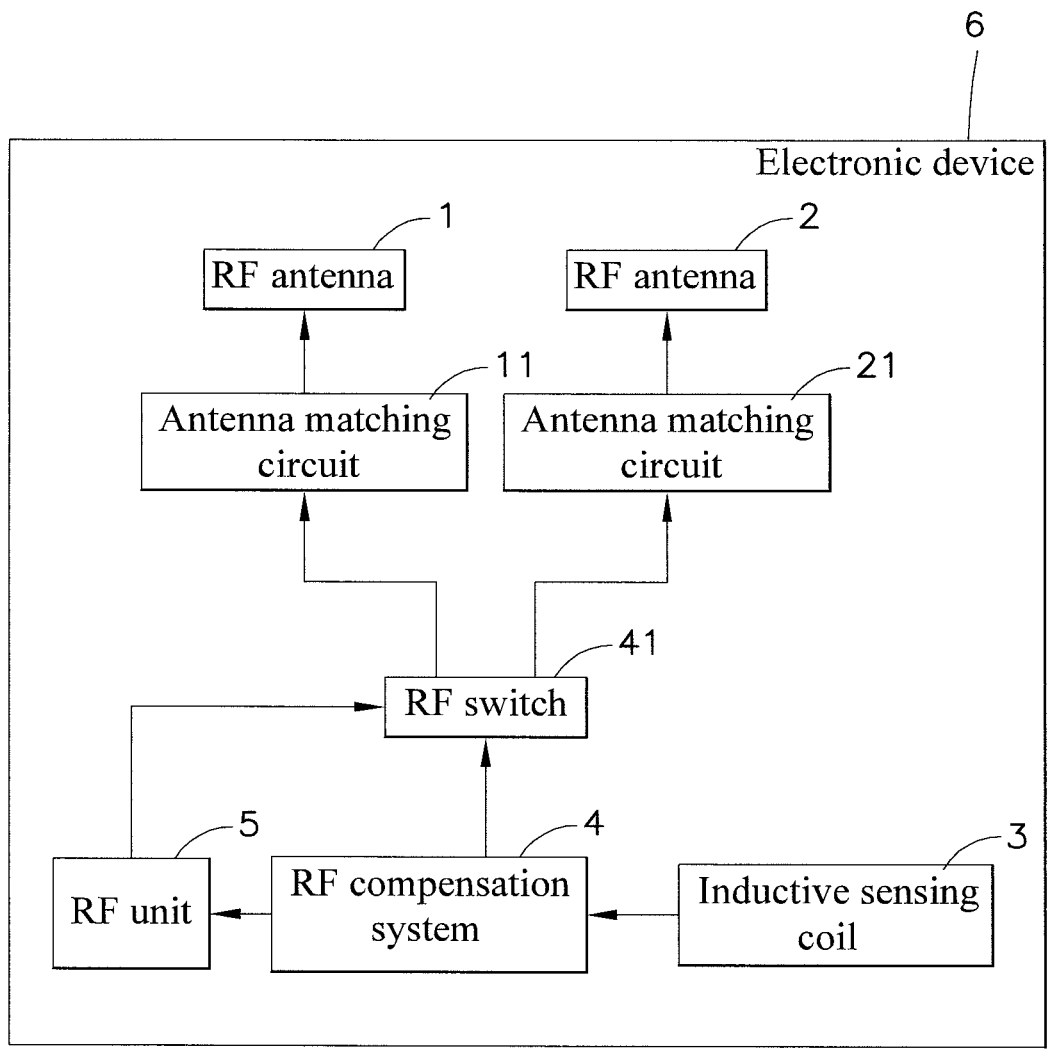
FIG. 9 is a simplified block diagram of an electric composite detection antenna of the second embodiment of the present invention.

Please refer to FIGS. 1 and 9, which are simplified block diagram of the electric composite detection antenna of the present invention, and simplified block diagram of the second embodiment, according to the present invention. The electric composite detection antenna be applicable to the preset electronic device 6, such as a mobile device which can be a smartphone or a tablet computer using the LTE system applying the 4G technology features for transmission. The electric composite detection antenna includes the RF antennas 1 and 2, the at least one inductive sensing coil 3, the RF compensation system 4, a RF switch 41, the RF unit 5, and the two antenna matching circuits 11 and 21. When the at least one inductive sensing coil 3 detects that the RF antenna 1 (or the RF antenna 2) is interfered by the change in the external environment parameters or a metal object close thereto, the at least one inductive sensing coil 3 can immediately detect which one of the RF antenna 1 and the RF antenna 2 of the mobile device is affected and interfered by the external metal object, and the RF compensation system 4 can transmit the detection signal to the RF unit 5, to control the RF switch 41 to switch from the interfered RF antenna to not-interfered one of the RF antenna 2 and the RF antenna 1, so that the RF signal can be transmitted through the non-interfered RF antenna 2 (or the RF antenna 1) without interference, so as to prevent the RF switch 41 from repeating switching operation for many times, and the non-interfered one of the RF antenna 2 and the RF antenna 1 can be detected in real time for stable transmission, and RF signal transmission power is not affected.

Figure 10:
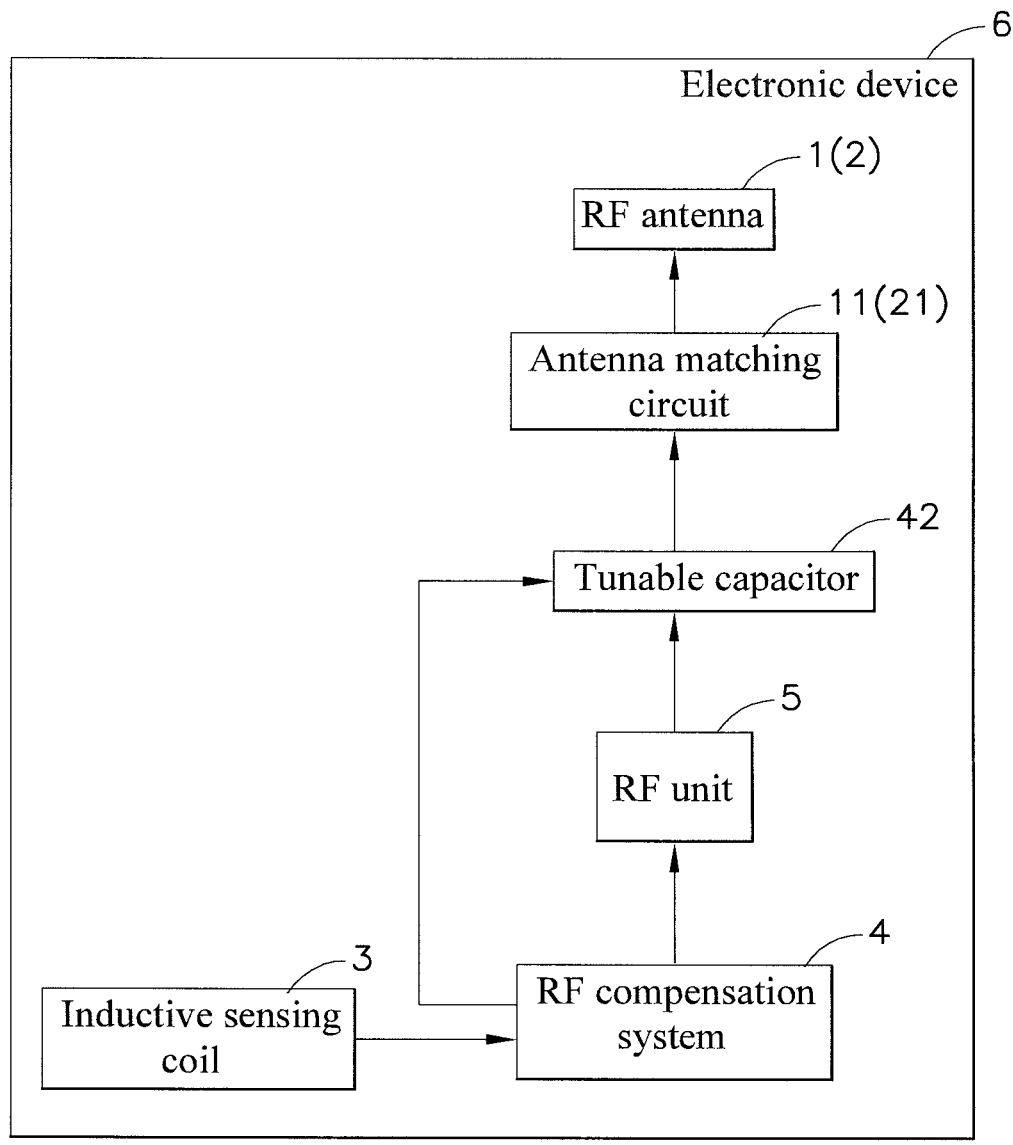
FIG. 10 is a simplified block diagram of an electric composite detection antenna of a third embodiment of the present invention.

Please refer to FIGS. 1 and 10, which are simplified block diagram of the electric composite detection antenna of the present invention and simplified block diagram of a third embodiment of the present invention. The electric composite detection antenna is applicable to the preset electronic device 6, such as a mobile device (such as smartphone or tablet computer) comprising a digital tunable capacitor which can dynamically change a matching parameter or impedance matching value. The electric composite detection antenna comprises the at least one RF antenna 1 (or the RF antenna 2), the at least one inductive sensing coil 3, the RF compensation system 4, a tunable capacitor 42, the RF unit 5, and the antenna matching circuit 11 (or the antenna matching circuit 21). The mobile device may have the outer shell with different design, such as outer shell made of insulating material, plastic material, or metal material; so the matching parameter and capacitor impedance of the RF antenna 1 (or the RF antenna 2) of the mobile device are also different. The at least one inductive sensing coil 3 of the present invention can preset the capacitor impedance of the tunable capacitor 42 for the environment parameters according to different outer shell of the mobile device made of insulating material, plastic material, or metal material. The at least one inductive sensing coil 3 can detect whether the RF antenna 1 (or the RF antenna 2) is affected by the change in external environment parameters or the metal object close thereto, and the RF compensation system 4 can transmit the detection signal to the RF unit 5, and transmit an adjustment instruction or a modulation signal to the tunable capacitor 42 for adjusting the capacitance value of the tunable capacitor 42 or the matching value of capacitor impedance of the tunable capacitor 42, and the RF unit 5 then controls the matching value of the capacitor impedance of the tunable capacitor 42 to be an ideal value. As a result, the antenna matching circuit 11 (or the antenna matching circuit 21) can enable the RF antenna 1 to keep good efficiency of RF signal transmission power, thereby transmitting the RF signal stably.

Figure 11:
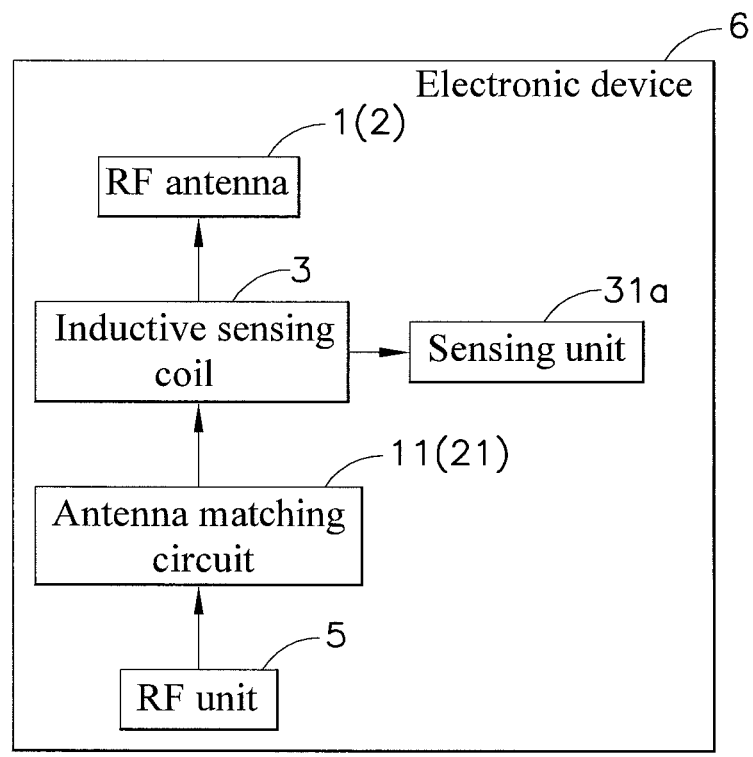
FIG. 11 is a simplified block diagram of an electric composite detection antenna of a fourth embodiment of the invention.
Figure 12:
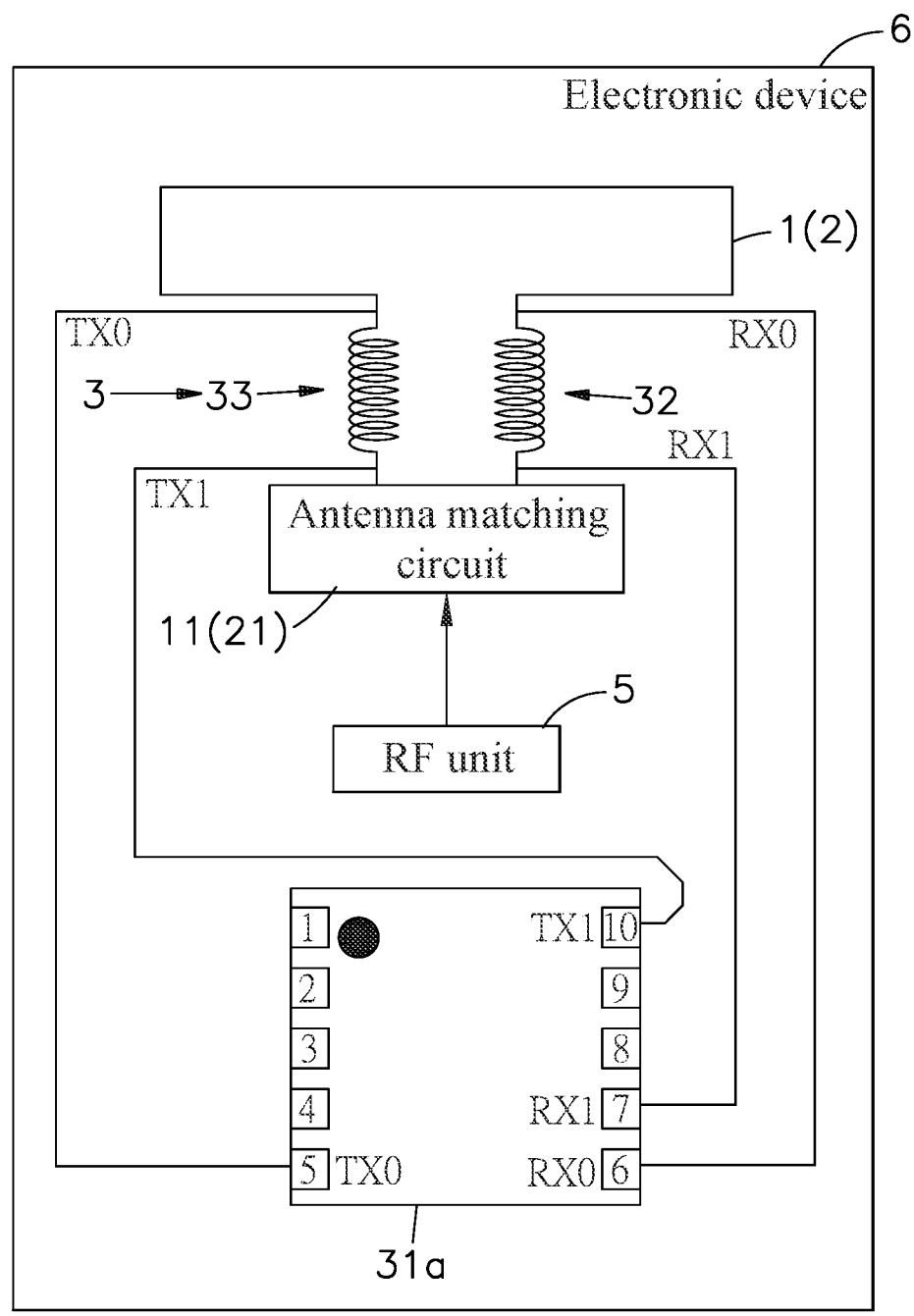
FIG. 12 is a simplified circuit diagram of an electric composite detection antenna of the fourth embodiment of the present invention.

Please refer to FIGS. 11 and 12, which are simplified block diagram and simplified circuit diagram of a fourth embodiment of the present invention. The electric composite detection antenna can comprise the at least one RF antenna 1 (or the RF antenna 2), the at least one inductive sensing coil 3 electrically connected to the at least one RF antenna 1 (or the RF antenna 2), a sensing unit 31a electrically connected to at least one inductive sensing coil 3, the at least one antenna matching circuit 11 (or the antenna matching circuit 21), and the RF unit 5. The electric composite detection antenna is applicable to the preset electronic device 6 having the communication interface (such as the RF antenna 1 or the RF antenna 2), and the at least one inductive sensing coil 3 can comprise two induction coils 32 and 33 electrically connected between the at least one RF antenna 1 (or the RF antenna 2) and the antenna matching circuit 11 (or the antenna matching circuit 21), respectively, and other two pins (TX0, TX1 and RX0, RX1) of the two induction coils 32 and 33 are electrically connected to the sensing unit 31a which is the wireless communication module 31, such as a chip with module number IQS620A. When the inductive sensing coil 3 detects that the RF antenna 1 (or the RF antenna 2) is interfered by the change in environment parameters, for example, when the preset electronic device 6 is located in remote mountainous areas, inside buildings or away from the base station area, or is close to an external metal object, the RF unit 5 can control the antenna matching circuit 11 (or the antenna matching circuit 21) to transmit an power adjustment instruction for increasing power, that is, the RF compensation system can transmit the power adjustment instruction to the antenna matching circuit 11 (or the antenna matching circuit 21) to increase gain of the RF antenna. The antenna matching circuit 11 (or the antenna matching circuit 21) can transmit the signal for increasing power, to the at least one inductive sensing coil 3. That is, the way of using the two induction coils 32 and 33 of the at least one inductive sensing coil 3 in cooperation with the sensing unit 31a can effectively extend the detection range of the RF antenna 1 (or the RF antenna 2), and increase power of the antenna matching circuit 11 (or the antenna matching circuit 21), so as to further increase the transmission power of the RF antenna 1 (or the RF antenna 2), to achieves the purpose of increasing RF signal transmission power of any one of the RF antennas 1 and 2, in real time, thereby preventing the power and quality of the RF signal transmission from being affected by the change in the external environmental parameters. As a result, the RF signal can be transmitted stably.

It should be noted that the above-contents are merely preferred embodiments of the present invention, and the claim scope of the present invention is not limited thereto. The electric composite detection antenna of the present invention uses the RF antennas 1 and 2 disposed at two opposite sides of the circuit system, respectively, and at least one inductive sensing coil 3 disposed on the circuit system of the preset electronic device 6, and the at least one inductive sensing coil 3 electrically connected to the RF compensation system 4, and the RF compensation system 4 electrically connected to the RF unit 5, so that the at least one inductive sensing coil 3 can be electrically connected to through the RF unit 5 through the RF compensation system 4; and, the RF unit 5 is electrically connected to the antenna matching circuits 11 and 21 of the RF antennas 1 and 2, and at least one inductive sensing coil 3 can detect whether the RF signal transmission power decrease or attenuation of the any RF antenna 1 (or the RF antenna 2), and the at least one inductive sensing coil 3 transmits the detection signal to the RF compensation system 4, and the RF compensation system 4 signal also transmits the detection signal to the RF unit 5. The RF unit 5 can control the other antenna matching circuit 21 to switch operation of the other RF antenna 2; alternatively, the RF compensation system 4 can transmit the power adjustment instruction to one of the antenna matching circuits 11 and 21 in real-time, to dynamically increase the antenna power of one of the RF antennas 1 and 2; alternatively, the RF compensation system 4 can further transmit the capacitor impedance matching adjustment instruction to the tunable capacitor 42, so that the RF unit 5 can adjust the capacitor impedance matching value to be an ideal value in real-time, thereby driving one of the antenna matching circuits 11 and 21 and one of the RF antennas 1 and 2. As a result, the preset electronic device 6 can maintain the RF signal transmission power effectively, and stably perform the RF signal transmission without being affected by the change in the external environment parameters. It should be noted that various equivalent structural changes, alternations or modifications based on the descriptions and figures of present disclosure are all consequently viewed as being embraced by the spirit and the scope of the present disclosure set forth in the claims.

The main concept of the electric composite detection antenna of the present invention is that two RF antennas and two antenna matching circuits are disposed on two opposite sides of the circuit system of the preset electronic device, respectively, and at least one inductive sensing coil is disposed in the circuit system and electrically connected to the RF compensation system and the RF unit, and the RF unit is electrically connected to the two antenna matching circuits, at least one inductive sensing coil can detect the decrease or attenuation of RF signal transmission power of any RF antenna caused by external environment effect or the change in external environment parameters, at least one inductive sensing coil sense signal can transmit the detection signal to the RF compensation system, and the detection signal is then transmitted to the RF unit, so that the RF unit can control the other antenna matching circuit to switch from the original antenna to the other antenna to operate, and the preset electronic device can maintain good RF signal transmission without being affected by external environment effect or the change in the environmental parameters. It should be noted that the above-contents are merely preferred embodiments of the present invention, and the present invention is not limited thereto. Various equivalent structural changes, alternations or modifications based on the descriptions and figures of present disclosure are all consequently viewed as being embraced by the spirit and the scope of the present disclosure set forth in the claims.

What is claimed is:

1. An electric composite detection antenna, disposed in a preset electronic device and comprising:
 a plurality of RF antennas;
 a plurality of inductive sensing coils;
 a RF compensation system, a RF unit; and
 a plurality of antenna matching circuits,
 wherein the plurality of RF antennas are electrically connected to the plurality of antenna matching circuits and disposed to different sides or opposite sides of the preset electronic device, respectively, and
 wherein the plurality of inductive sensing coils are configured to detect magnitudes of the transmission signals generated by the plurality of RF antennas, and transmit the detection results to the RF compensation system, so as to drive the RF unit electrically connected the RF compensation system, to adjust an application mode of the preset electronic device,
 wherein the RF unit is electrically connected to a RF switch,
 wherein in the application mode, the RF unit controls one of a plurality of antenna matching circuits through the RF switch, to switch from one of a plurality of RF antennas to the other of the plurality of RF antennas for transmitting the RF signal,
 wherein the plurality of RF antennas are antennas of the same frequency band,
 wherein a preset electronic device is a smartphone or a tablet computer, and a RF compensation system is a central processor, a microprocessor, or a chip,
 wherein the RF compensation system and the RF unit are electrically connected to a tunable capacitor, and
 wherein the at least one inductive sensing coil detects one of the RF antennas affected by external environment or close to a metal object, the RF compensation system drives the RF unit to control one of the antenna matching circuits or one of the RF antennas for stabilizing the transmission RF signal.

2. The electric composite detection antenna of claim 1, wherein in the application mode, the RF compensation system transmits a modulation signal to the tunable capacitor, and the RF unit adjusts an impedance matching value of the tunable capacitor according to the modulation signal, and drive an antenna matching circuit and a RF antenna according to an impedance matching result.

* * * * *